(12) United States Patent
Tsuda et al.

(10) Patent No.: US 9,019,046 B2
(45) Date of Patent: Apr. 28, 2015

(54) ELASTIC WAVE FILTER

(71) Applicant: Nihon Dempa Kogyo Co., Ltd., Tokyo (JP)

(72) Inventors: Tadaaki Tsuda, Saitama (JP); Takashi Ohtani, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 164 days.

(21) Appl. No.: 13/862,469

(22) Filed: Apr. 15, 2013

(65) Prior Publication Data

US 2013/0278358 A1 Oct. 24, 2013

(30) Foreign Application Priority Data

Apr. 18, 2012 (JP) ................. 2012-094878

(51) Int. Cl.
*H03H 9/00* (2006.01)
*H03H 9/64* (2006.01)
*H03H 9/145* (2006.01)

(52) U.S. Cl.
CPC ............. *H03H 9/64* (2013.01); *H03H 9/14505* (2013.01); *H03H 9/14558* (2013.01)

(58) Field of Classification Search
USPC .......................................... 333/193–196, 133
See application file for complete search history.

(56) References Cited

U.S. PATENT DOCUMENTS

| 2009/0002099 A1* | 1/2009 | Kajihara | 333/193 |
| 2009/0167462 A1* | 7/2009 | Bergmann | 333/193 |
| 2010/0176900 A1* | 7/2010 | Tanaka | 333/195 |

FOREIGN PATENT DOCUMENTS

JP          02-072709          3/1990

* cited by examiner

*Primary Examiner* — Lincoln Donovan
*Assistant Examiner* — Thomas Skibinski
(74) *Attorney, Agent, or Firm* — Jianq Chyun IP Office

(57) ABSTRACT

An elastic wave filter includes electrode fingers, a first busbar and a second busbar, and inclined electrode portions each having a narrower distance between the electrode fingers from the first busbar toward the second busbar. The elastic wave filter includes a dummy electrode disposed in at least one of the input-side IDT electrode portion and the output-side IDT electrode portion to suppress reflection of a diffracted elastic wave by the busbar and to suppress spurious response at an end portion in a frequency pass-band. The dummy electrode has a width dimension and a pitch that are determined such that none of a period shorter than a shortest period of the electrode fingers and a period longer than a longest period of the electrode fingers is satisfied.

8 Claims, 13 Drawing Sheets

ELASTIC WAVE FILTER

CROSS REFERENCE TO RELATED APPLICATIONS

This application claims the priority benefit of Japan application serial no. 2012-094878, filed on Apr. 18, 2012. The entirety of the above-mentioned patent application is hereby incorporated by reference herein and made a part of this specification.

TECHNICAL FIELD

This disclosure relates to an elastic wave filter such as a surface acoustic wave (SAW) filter.

DESCRIPTION OF THE RELATED ART

The SAW device uses a surface acoustic wave. In this SAW device, on a piezoelectric substrate, an electrode called an interdigital transducer (IDT) is arranged along a propagation direction of an elastic wave as an input-side electrode portion and an output-side electrode portion. The SAW device performs, between these two electrode portions, an electromechanical interconversion between an electrical signal and an elastic wave to provide a frequency selection (band-pass filter) characteristic. As one SAW device, a SAW filter is used as a band-pass filter for various communication devices such as a mobile phone where sophistication in performance and miniaturization have been progressing. Nowadays, with advances in speeding up and enlarging capacity of wireless data communication, a SAW filter that has excellent frequency selectivity and high flatness of attenuation characteristic in the frequency pass-band is required.

A known method for widening the frequency pass-band as described above employs a filter using, for example, a tapered IDT electrode portion. In this filter, as illustrated in FIG. 13, on the piezoelectric substrate 10, the tapered IDT electrode portions are arranged such that respective width dimensions and distance dimensions of electrode fingers 15 and reflecting electrodes 16 expand from a busbar 14a at one side toward a busbar 14b at the other side. Tapered IDT electrode portions are used as an input-side IDT electrode portion 11 and an output-side IDT electrode portion 12. Between these electrode portions 11 and 12, a shield electrode 36 formed of, for example, a square metal film is arranged.

The width dimensions and the distance dimensions of the electrode fingers 15 and the reflecting electrodes 16 in this filter have a period unit λ repeated by a predetermined distance, and correspond to a wavelength of the propagating elastic wave. The period unit λ is configured such that the period unit λ has a constant period along the propagation direction of the elastic wave. Additionally, the period unit λ is configured such that elastic waves from an elastic wave through a track (a propagation path) for a short wavelength to an elastic wave through a track for a long wavelength propagate from the busbar 14a at the one side to the busbar 14b at the other side, that is, such that the frequency pass-band becomes wider. Accordingly, in this filter, on both end portions in the propagation direction of the elastic wave at the respective electrodes, the electrode fingers 15 connect to the busbars 14a to 14d in inclined positions. That is, angles between the respective electrode fingers 15 at these end portions and the busbars 14a to 14d are smaller than 90°. This causes leakage of the elastic wave due to the diffraction of the elastic wave. Reflection of the leaked elastic wave by the busbars 14a to 14d deteriorates the attenuation characteristic within the frequency pass-band. This causes spurious response at an edge of the frequency pass-band.

Nowadays, in a surface acoustic wave filter, further widening of the pass frequency characteristic is required. Accordingly, a taper angle becomes increasingly smaller, thus causing larger influence of the diffraction effect. Conventionally, the filters have had an impedance outside of the vicinity of 50Ω to suppress spurious response while this type of filter degrades insertion loss. Additionally, standard for reflection characteristics in a general pass-band have become more stringent. Accordingly, shifting the impedance is also becoming difficult. While in FIG. 9 of Japanese Unexamined Patent Application Publication No. H02-72709 a method for adjusting the frequency characteristics of the tapered electrodes is disclosed, suppression of spurious response that appears in a frequency band is not indicated.

A need thus exists for an elastic wave filter which is not susceptible to the drawback mentioned above.

SUMMARY

An elastic wave filter according to this disclosure includes electrode fingers, a first busbar and a second busbar, and inclined electrode portions each having a narrower distance between the electrode fingers from the first busbar toward the second busbar. The inclined electrode portions are constituted as an input-side IDT electrode portion and an output-side IDT electrode portion. The input-side IDT electrode portion and the output-side IDT electrode portion are separated from one another in a propagation direction of an elastic wave. The elastic wave filter includes a dummy electrode disposed in at least one of the input-side IDT electrode portion and the output-side IDT electrode portion to suppress reflection of a diffracted elastic wave by the busbar and to suppress spurious response at an end portion in a frequency pass-band. The dummy electrode is disposed between: a distal end of the electrode fingers extending from one busbar among the first busbar and the second busbar; and another busbar. The dummy electrode is disposed separately from the distal end and extends from the other busbar. The dummy electrode has a width dimension and a pitch that are determined such that none of a period shorter than a shortest period of the electrode fingers and a period longer than a longest period of the electrode fingers is satisfied.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1:
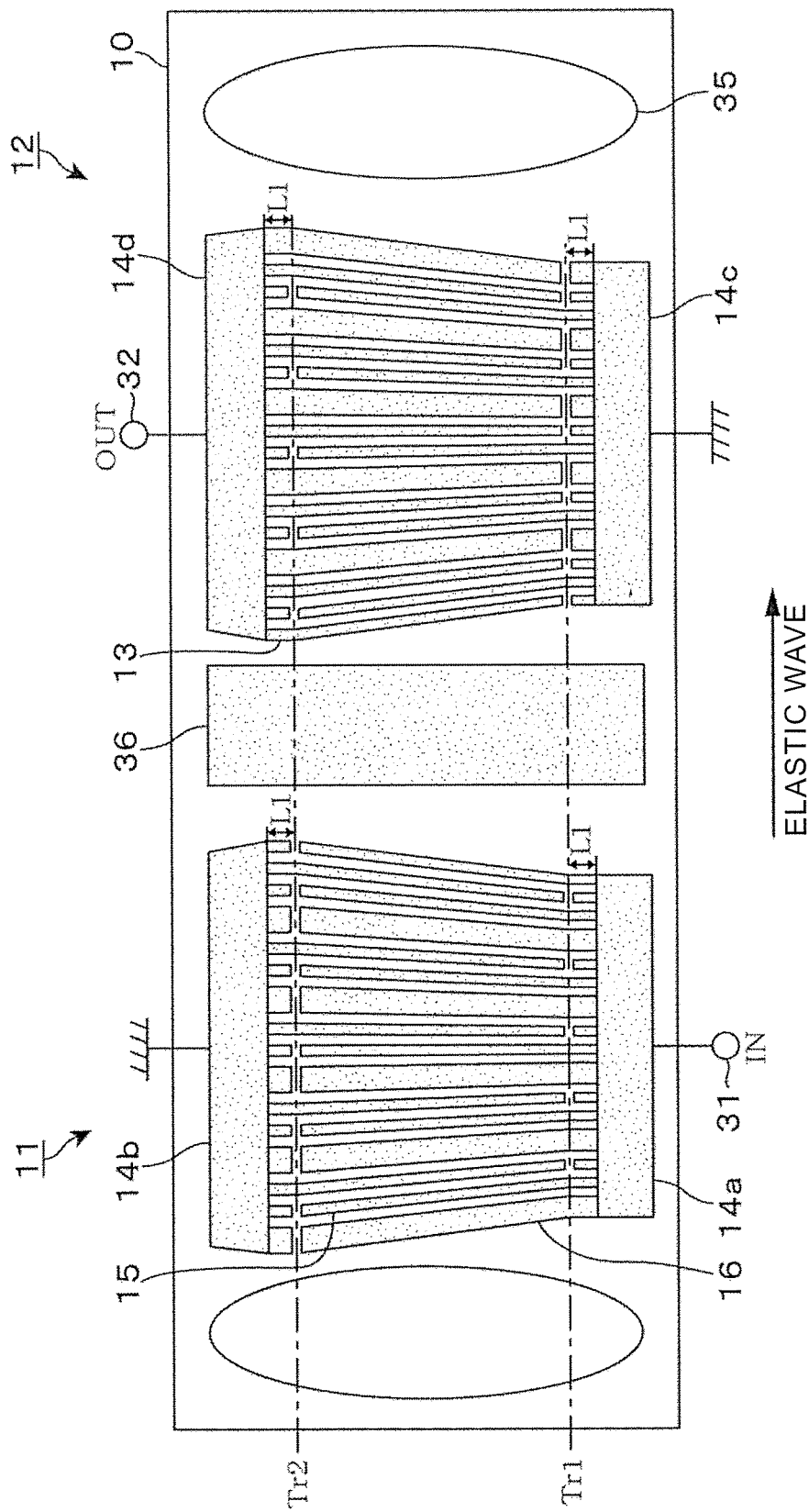
FIG. 1 is a plan view illustrating an exemplary elastic wave filter according to an embodiment of this disclosure.

A description will be given of an elastic wave filter according to an embodiment of this disclosure by referring to FIG. 1 and FIG. 2. The elastic wave filter of this disclosure includes an input-side IDT electrode portion 11 and an output-side IDT electrode portion 12, and is formed on a piezoelectric substrate 10 such as $LiNbO_3$ (lithium niobate). These IDT electrode portions 11 and 12 are disposed at a distance along a propagation direction of an elastic wave. Between the IDT electrode portions 11 and 12, a square shield electrode 36 connected to the ground potential is arranged. This elastic wave filter is formed by photolithography as follows. For example, a metal film such as aluminum is formed over the entire surface of the piezoelectric substrate 10. Subsequently, regions other than the above-describe electrodes are etched through a mask layer that is laminated on this metal film. Here, in the drawing, a sound absorbing material (damper) 35 is illustrated. The damper 35 absorbs unnecessary elastic waves that propagate to end regions of the piezoelectric substrate 10 through the IDT electrode portions.

The input-side IDT electrode portion 11 includes a busbar 14a at one side and a busbar 14b at the other side. The busbar 14a and the busbar 14b are respectively formed at one side and the other side in FIG. 1 parallel to each other along the propagation direction of the elastic wave. The busbar 14b at the other side is grounded while the busbar 14a at one side connects to the input port 31. In FIG. 1, electrode fingers 15 are illustrated. The electrode fingers 15 alternately extend in a comb shape from the respective busbars 14a and 14b disposed in the above-described input-side IDT electrode portion 11. Here, in the input-side IDT electrode portion 11, a direction from the input-side IDT electrode portion 11 toward the output-side IDT electrode portion 12 is defined as a forward direction. In the output-side IDT electrode portion 12, a direction from the output-side IDT electrode portion 12 toward the input-side IDT electrode portion 11 is defined as a forward direction while a direction from the input-side IDT electrode portion 11 toward the output-side IDT electrode portion 12 is defined as a reverse direction.

In this input-side IDT electrode portion 11, reflecting electrodes 16 are disposed in a plurality of portions to reflect an elastic wave that propagates in the reverse direction in the input-side IDT electrode portion 11 toward a direction of the output-side IDT electrode portion 12. The reflecting electrodes 16 extend from the busbar 14a at one side to the busbar 14b at the other side along a longitudinal direction of the electrode fingers 15. Therefore, this IDT electrode portion is constituted as single phase uni-directional transducer (SPUDT) such as a distributed acoustic reflection transducer (DART).

Figure 2:
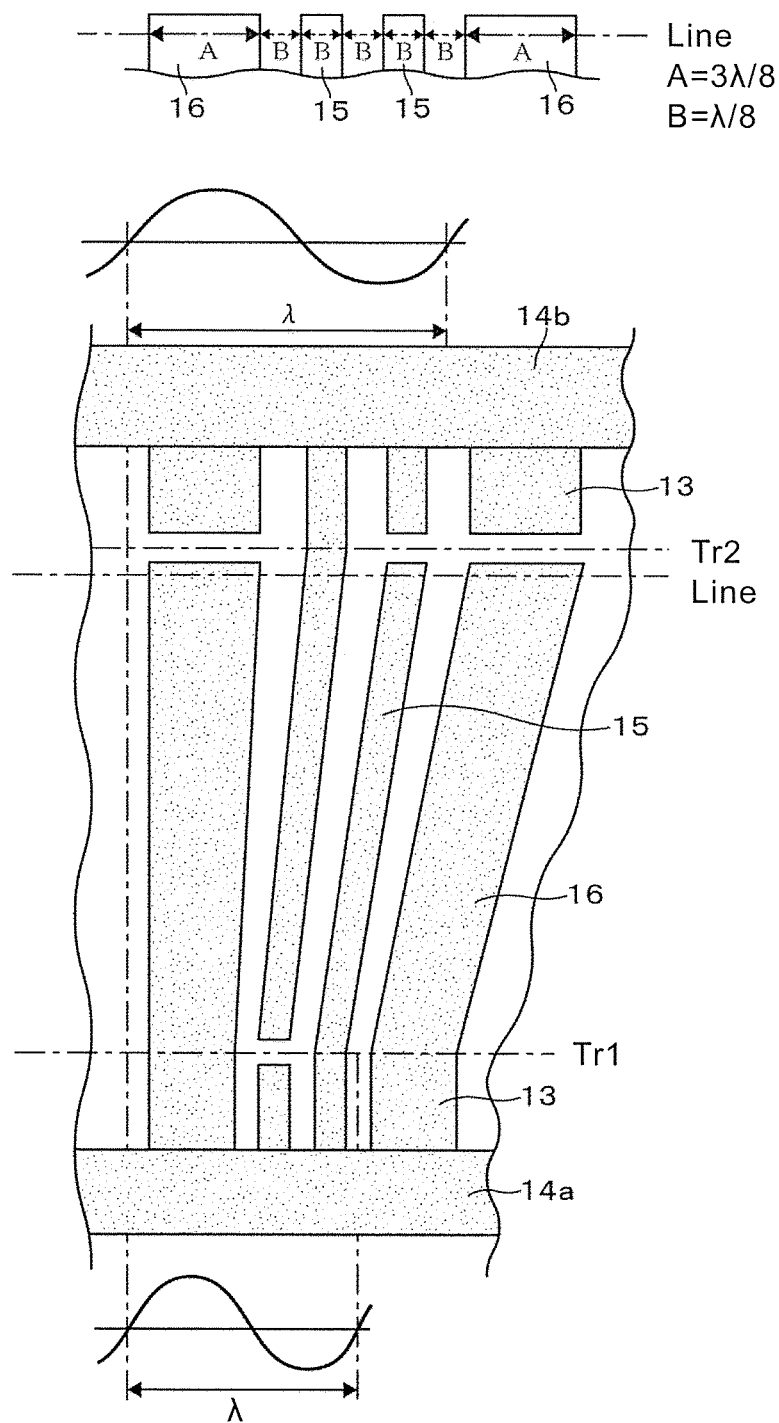
FIG. 2 is a partially enlarged plan view of the elastic wave filter according to the embodiment of this disclosure.

As illustrated in FIG. 2, these electrode fingers 15 and reflecting electrodes 16 have an arrangement pattern that is a combination of a pair of electrode fingers 15 and one reflecting electrode 16. The pair of electrode fingers 15 extend from the one busbar 14a and the other busbar 14b that are formed adjacent to each other. The reflecting electrodes 16 extend from the one busbar 14a adjacent to these electrode fingers 15. This arrangement pattern periodically repeats by a predetermined period unit λ along the propagation direction of the elastic wave. In this elastic wave filter, as illustrated in FIG. 2, the respective electrode fingers 15 have a width dimension of λ/8 with respect to the period unit λ while the reflecting electrodes 16 have a width dimension of 3λ/8. The electrode fingers 15 and the reflecting electrodes 16 are configured to have respective distance dimensions of λ/8.

The electrode fingers 15 and the reflecting electrodes 16 are set such that the distance dimensions and the width dimensions gradually expand from the one busbar 14a toward the other busbar 14b. Accordingly, a group of tracks Tr with the period unit λ corresponding to these distance dimensions and width dimensions is formed between the one busbar 14a and the other busbar 14b. A track Tr1 with the narrowest period unit λ and a track Tr2 with the broadest period unit λ determine a pass-band of the filter. In FIG. 1, the width dimensions of the electrode fingers 15 and the reflecting electrodes 16 are illustrated to be constant because of the difficulty of illustration.

In this embodiment, dummy electrodes 13 are disposed in portions at the busbar 14a side and the busbar 14b side outside of the interval between the track Tr1 and the track Tr2. The dummy electrodes 13 extend in a comb shape in the directions of the tracks Tr from the respective busbars 14a and 14b. This elastic wave filter is constituted as a transversal elastic wave filter. Accordingly, standards and arrangement patterns of portions of the electrode fingers 15 and the reflecting electrodes 16 where the elastic wave filter is disposed are not changed. The electrode fingers 15 and the reflecting electrodes 16 have the same configurations as the electrode fingers 15 and the reflecting electrodes 16 of the known elastic wave filter illustrated in FIG. 9. Hereinafter, the one busbar 14a positioned at the track Tr1 side is referred to as a high-pass side busbar 14a while the other busbar 14b positioned at the track Tr2 side is referred to as a low-pass side busbar 14b.

The dummy electrodes 13 are disposed at a gap where positions of the high-pass side and low-pass side busbars 14a and 14b are separated in parallel compared with, for example, the known elastic wave filter. The dummy electrodes 13 are disposed at the respective electrode fingers 15 and the respective reflecting electrodes 16 at the high-pass side and low-pass side busbars 14a and 14b one for each. The electrode fingers 15 and the reflecting electrodes 16 are tapered. Accordingly, respective width dimensions at the high-pass side and the low-pass side are different from one another. Therefore, the dummy electrode 13 disposed at the high-pass side and the low-pass side have respective width dimensions different from one another. In the input-side IDT electrode portion 11, the high-pass side dummy electrodes 13 are set to have minimum width dimensions of the electrode fingers 15 and the reflecting electrodes 16 corresponding to the shortest period while the low-pass side dummy electrodes 13 are set to have maximum width dimensions of the electrode fingers 15 and the reflecting electrodes 16. The dummy electrodes 13 extend from the respective busbars 14a and 14b toward the electrode fingers 15 and the reflecting electrodes 16. The dummy electrodes 13 are not tapered, and extend perpendicularly from the busbars 14a and 14b. All the dummy electrodes 13 disposed at the same busbar 14a (14b) have the same length.

In this example, the reflecting electrodes 16 in the input-side IDT electrode portion 11 continuously extends from the dummy electrode 13 disposed at the high-pass side busbar 14a toward the low-pass side busbar 14b, and has a distal end separated from the low-pass side dummy electrode 13 across a gap. The electrode fingers 15 include a first electrode finger 15 and a second electrode finger 15 that are alternately arranged. The first electrode finger 15 continuously extends from the high-pass side dummy electrode 13 toward the low-pass side busbar 14b, and has a distal end arranged across a gap from the low-pass side dummy electrode 13. The second electrode finger 15 continuously extends from the low-pass side dummy electrode 13 toward the high-pass side busbar 14b, and has a distal end arranged across a gap with the high-pass side dummy electrode 13. Thus, the electrode fingers 15 are arranged in a comb shape and form one period unit with the reflecting electrodes 16 and the alternately arranged electrode fingers 15. The similar period is repeated.

In the output-side IDT electrode portion 12, the respective width dimensions and the respective distance dimensions of the electrode fingers 15 and the reflecting electrodes 16 are formed similarly to those of the above-described input-side IDT electrode portion 11. The output-side IDT electrode portion 12 includes, as illustrated in FIG. 1, a busbar 14c at one side (one side) and a busbar 14d at the other side. The one busbar 14c is grounded while the busbar 14d at the other side connects to the output port 32. The output-side IDT electrode portion 12 includes the electrode fingers 15 and the reflecting electrodes 16 that are arranged in the following arrangement pattern. The period unit λ is constant along the propagation direction of the elastic wave similarly to the input-side IDT electrode portion. Additionally, the period unit λ expands from the busbar 14c at one side toward the busbar 14d at the other side in a range from the track Tr1 to the track Tr2. In the output-side IDT electrode portion 12, the reflecting electrodes 16 extends from the busbar 14d at the other side. Also in the output-side IDT electrode portion 12, similarly to the input-side IDT electrode portion 11, the dummy electrodes 13 are disposed corresponding to the arrangement pattern of the electrode fingers 15 and the reflecting electrodes 16.

Next, an operation of the above-described embodiment will be described. Input of a high-frequency signal to the input-side IDT electrode portion 11 through the input port 31 generates an elastic wave of a surface acoustic wave (SAW). This elastic wave in the input-side IDT electrode portion 11 propagates through the forward directions of tracks Tr with a period unit λ corresponding to its wavelength. Subsequently, in the respective tracks Tr, the elastic wave propagates from the input-side IDT electrode portion 11 toward the output-side IDT electrode portion 12 (passes through the region between which the electrode fingers 15 intersect each other). In this propagation, an elastic wave with a wavelength corresponding to each period unit of the track Tr is gradually strengthened, or an elastic wave with a wavelength different from each period unit λ of the track Tr is gradually attenuated.

Therefore, as the elastic wave propagates toward the output-side IDT electrode portion 12, a frequency pass-band of a main lobe (an absolute bandwidth) is narrowed in each of the tracks Tr. Subsequently, the elastic wave is, for example, taken out through the output port 32 in the output-side IDT electrode portion 12, and processed by electromechanical interconversion so as to be taken out as an electrical signal of a high-frequency signal.

As described above (see FIG. 9), in the tapered IDT electrode portion, the electrode fingers 15 do not orthogonally connect to the busbars 14a to 14d. Accordingly, elastic waves leaked from the end portions of the electrode fingers 15 are reflected by the busbars 14a to 14d and affect the attenuation characteristic of the frequency pass-band. In the elastic wave filter of this disclosure, the dummy electrodes 13 are disposed between the respective electrode fingers 15 and the busbars 14a to 14d. This suppresses reflection of the diffracted elastic wave by the busbars 14a to 14d.

Figure 3:
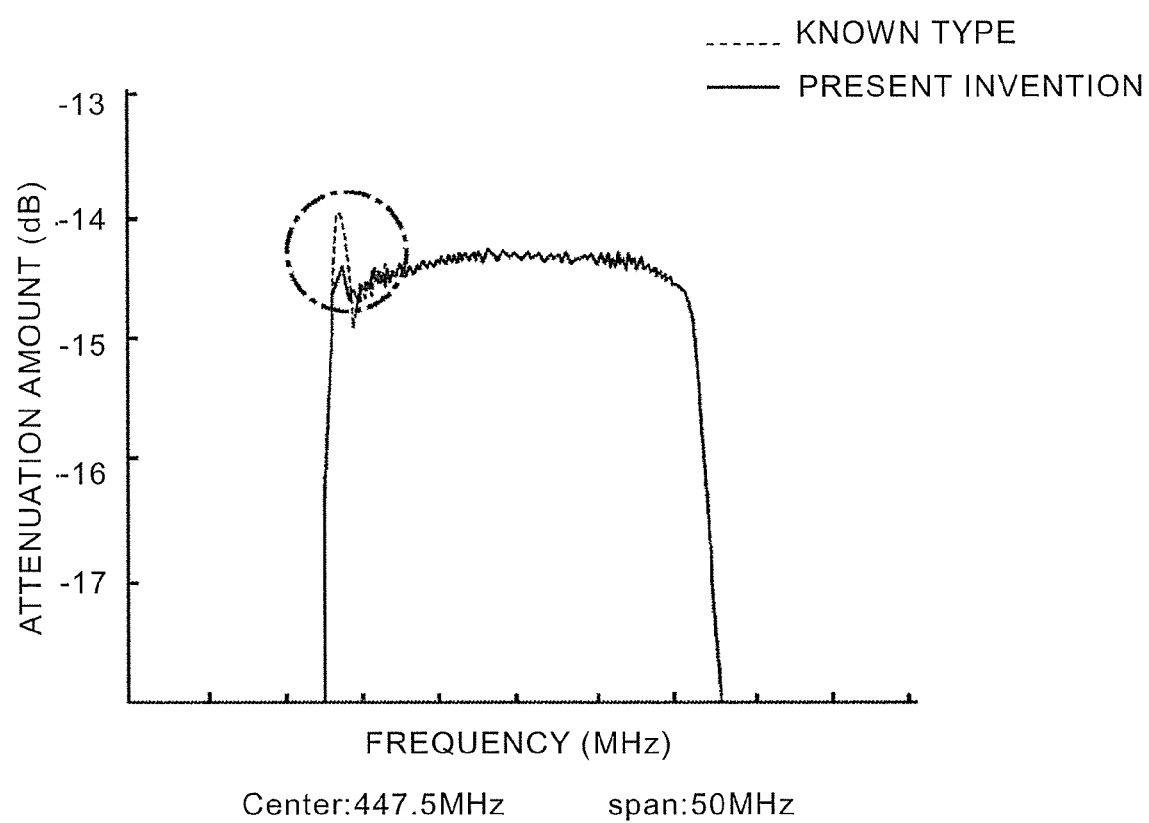
FIG. 3 is a characteristic graph illustrating a characteristic obtained in the elastic wave filter according to the embodiment of this disclosure.
Figure 4:
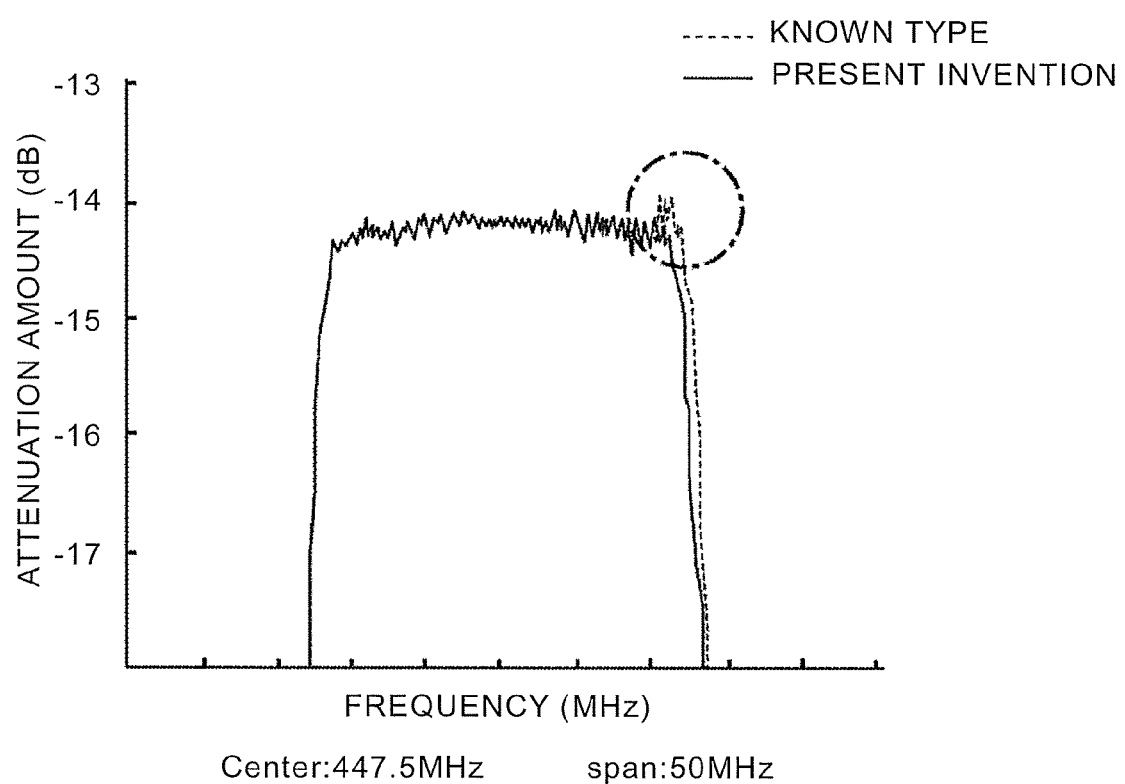
FIG. 4 is a characteristic graph illustrating a characteristic obtained in the elastic wave filter according to the embodiment of this disclosure.

A position and a size of a spurious response that appears in the attenuation characteristic of the elastic wave filter is varied depending on the elastic wave filter as illustrated in FIG. 3 and FIG. 4. That is, at the high-pass side (the Tr1 side) and the low-pass side (the Tr2 side), the period units λ are different from each other. The spurious response appears in a different position depending on which track side diffraction of the elastic wave and reflection by the busbar intensely occur. Accordingly, respective designed elastic wave filters are different in that the dummy electrodes 13 are to be disposed at the high-pass side busbars 14a and 14c or to be disposed at the low-pass side busbars 14b and 14d in the IDT electrode portions 11 and 12.

For example, as illustrated in FIG. 3, in the case of an elastic wave filter where the spurious response appears in the low-pass side end portion of the frequency pass-band, the dummy electrodes 13 are disposed at the track Tr2 side (the low-pass side) of the input-side IDT electrode portion 11 and the output-side IDT electrode portion 12. This suppresses the spurious response generated at the low-pass side. Conversely, in the case of an elastic wave filter where the spurious response appears in the high-pass side end portion, the dummy electrodes 13 are disposed at the track Tr1 side (the high-pass side) of the input-side IDT electrode portion 11 and the output-side IDT electrode portion 12. This suppresses the spurious response generated at the high-pass side of the frequency pass-band as illustrated in FIG. 4.

As described above, any of the respective busbars 14a to 14d at the high frequency side and the low frequency side in both the tapered (inclined) IDT electrode portions 11 and 12 includes the dummy electrodes 13 as described above. This suppresses reflection of the leaked elastic wave, which is caused by diffraction, by the busbars 14a to 14d so as to suppress occurrence of the spurious response within the frequency pass-band of the elastic wave.

Figure 5:
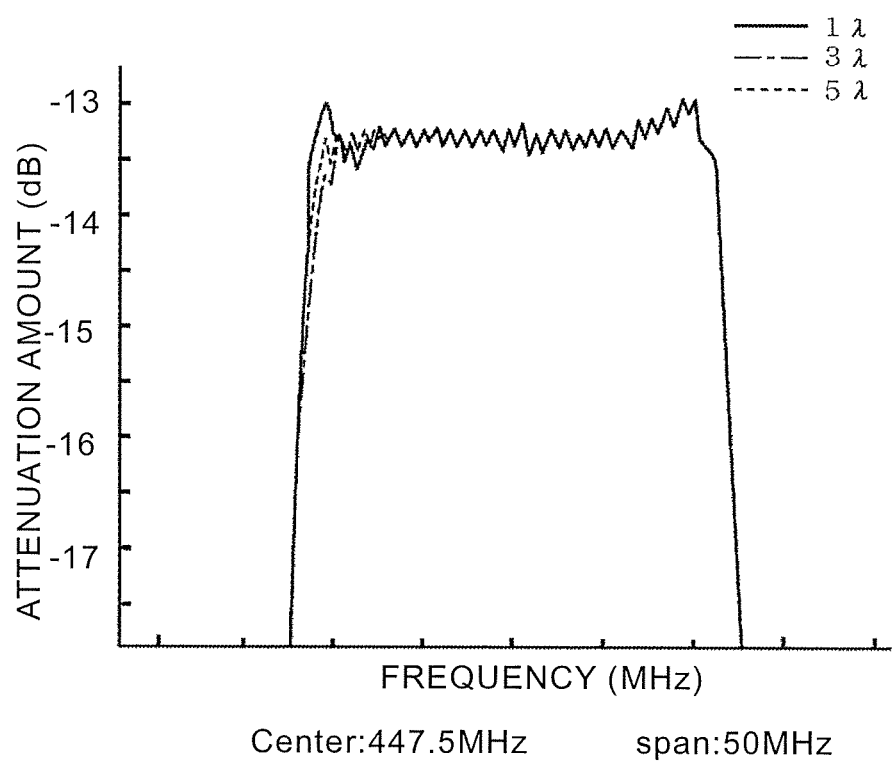
FIG. 5 is a characteristic graph illustrating an attenuation characteristic obtained in an elastic wave filter according to another embodiment.
Figure 6:
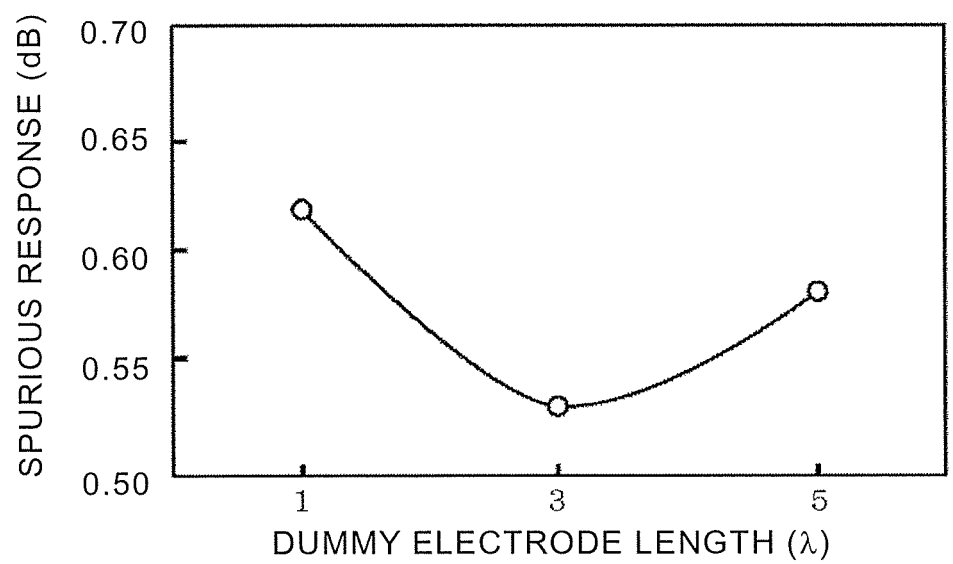
FIG. 6 is a characteristic graph illustrating the attenuation characteristic obtained in the elastic wave filter according to the other embodiment.

Here, the inventors of this disclosure varied the length of the dummy electrode 13 to be arranged, and discovered that the effect for suppressing occurrence of the spurious response in the frequency pass-band was varied depending on the length condition. In the case where elastic wave filters with extended length of the dummy electrode 13 were designed, the effect for suppressing the spurious response was varied. FIG. 5 is a characteristic graph illustrating attenuation characteristics in the cases where the dummy electrodes 13 with respective lengths of 1λ, 3λ, and 5λ are disposed. FIG. 6 is a characteristic graph illustrating magnitudes (maximum values among differences between maximal loss and minimal loss in the case where the local maximal value of an attenuation amount exists within the pass-band) of the spurious response generated under the respective conditions. In the case where the length of the dummy electrode 13 is set to 1λ, 3λ, and 5λ the spurious response appears with the magnitude of 0.62 dB, 0.53 dB, and 0.59 dB. It has been discovered that the effect of suppression is varied depending on the length of the arranged dummy electrode 13.

Figure 7:
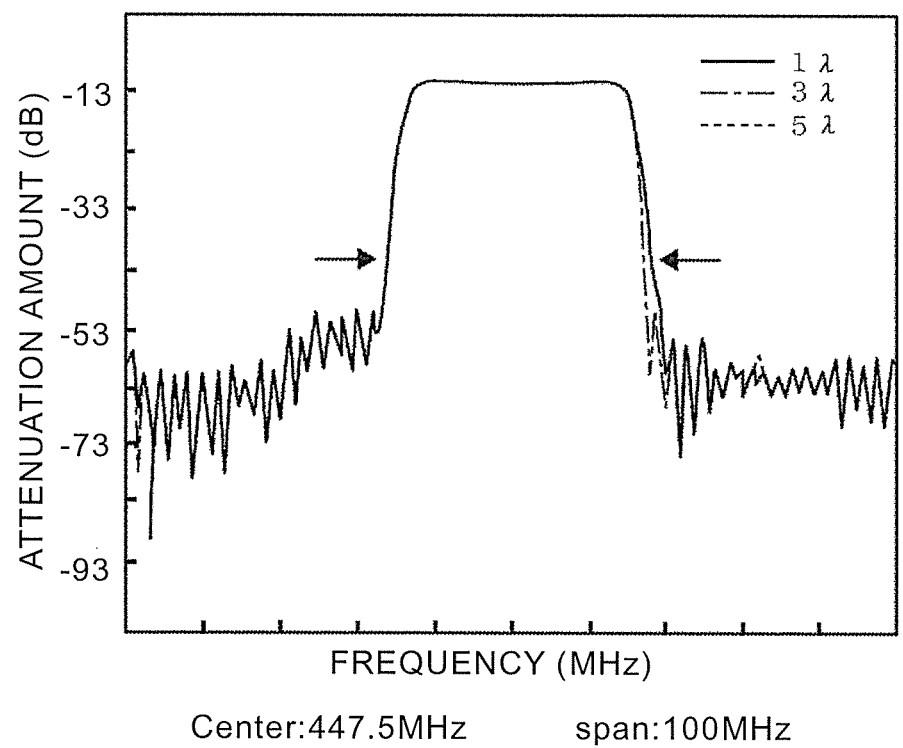
FIG. 7 is a characteristic graph illustrating an attenuation characteristic obtained in an elastic wave filter according to another embodiment.
Figure 8:
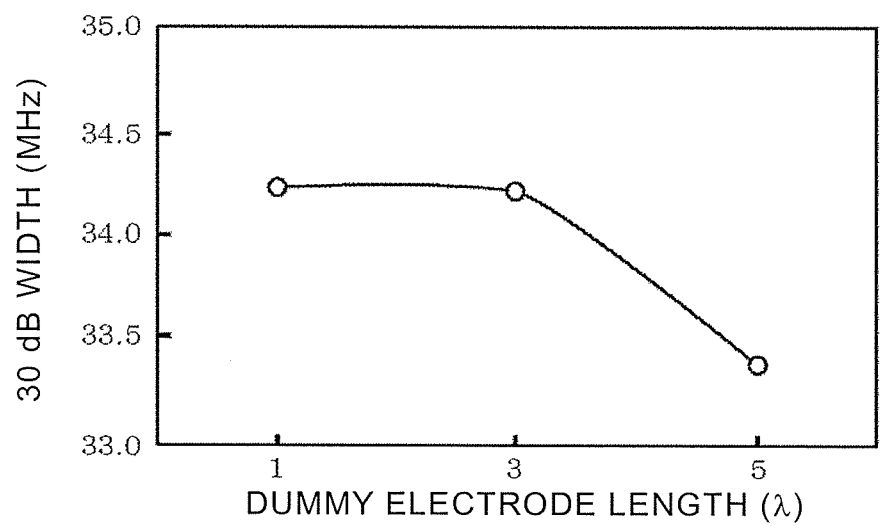
FIG. 8 is a characteristic graph illustrating the attenuation characteristic obtained in the elastic wave filter according to the other embodiment.

FIG. 7 is a characteristic graph illustrating attenuation characteristics in the cases where the dummy electrodes 13 with respective lengths of 1λ, 3λ, and 5λ are disposed. FIG. 8 illustrates frequency widths in the attenuation characteristic with the attenuation amount of 30 dB in the cases where the dummy electrodes 13 with the respective lengths in FIG. 7 are disposed. In the case where the length of the dummy electrode 13 is set to 1λ, 3λ, and 5λ, the frequency width with the attenuation amount of 30 dB becomes 34.28 MHz, 34.23 MHz, and 33.39 MHz. In the case where the length of the dummy electrode 13 is varied as illustrated in FIG. 5 and FIG. 6, the effect for suppressing the spurious response is varied. Conversely, the variation in length of the dummy electrode 13 causes variation in width of the frequency pass-band as illustrated in FIG. 7 and FIG. 8. Accordingly, the optimal length of the dummy electrode 13 to be set is varied depending on design conditions of the elastic wave filter, and necessary to be determined by preliminarily performing simulation and actually driving the elastic wave filter.

Figure 9:
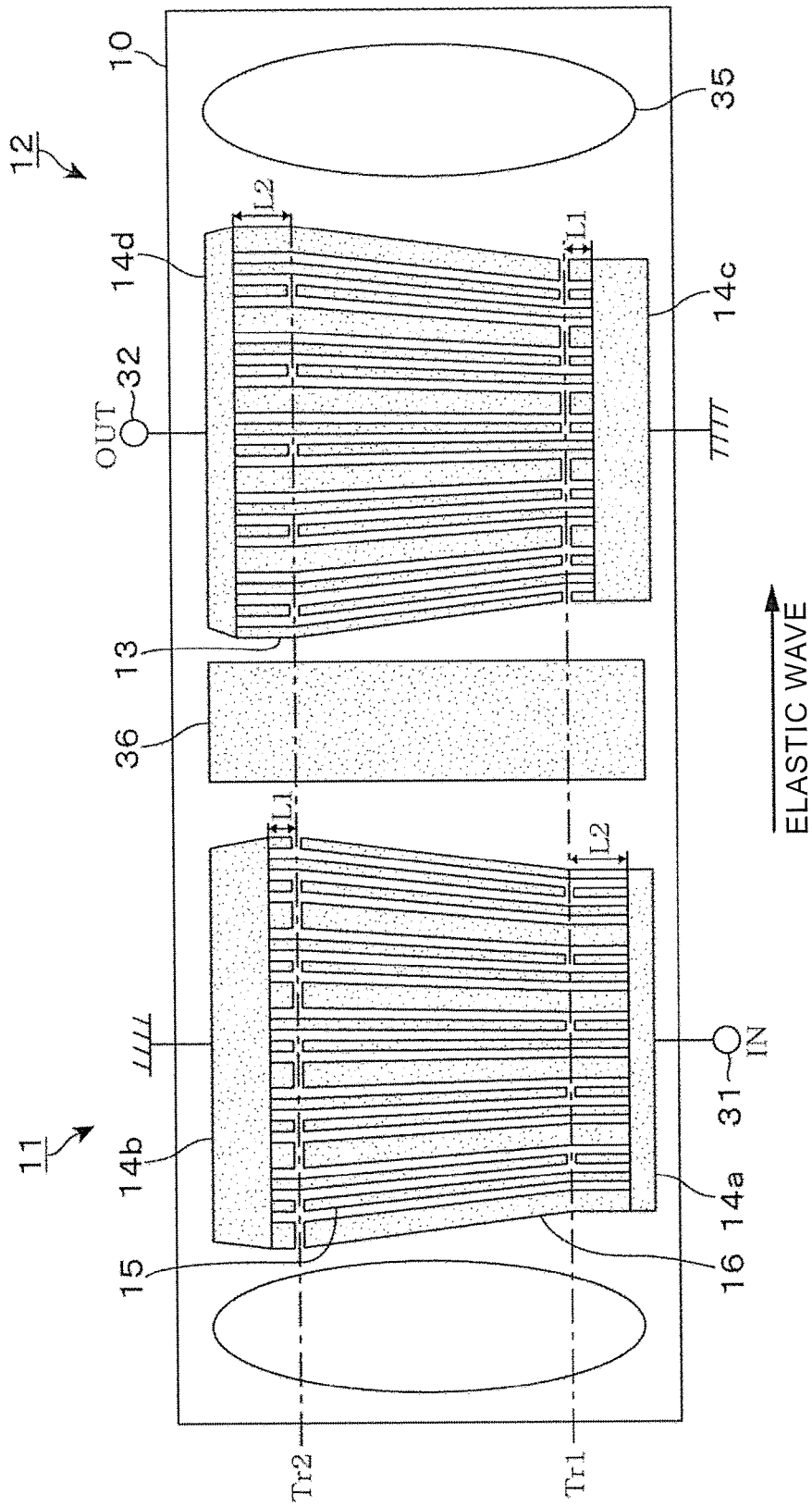
FIG. 9 is a plan view illustrating an exemplary elastic wave filter according to the embodiment of this disclosure.
Figure 10:
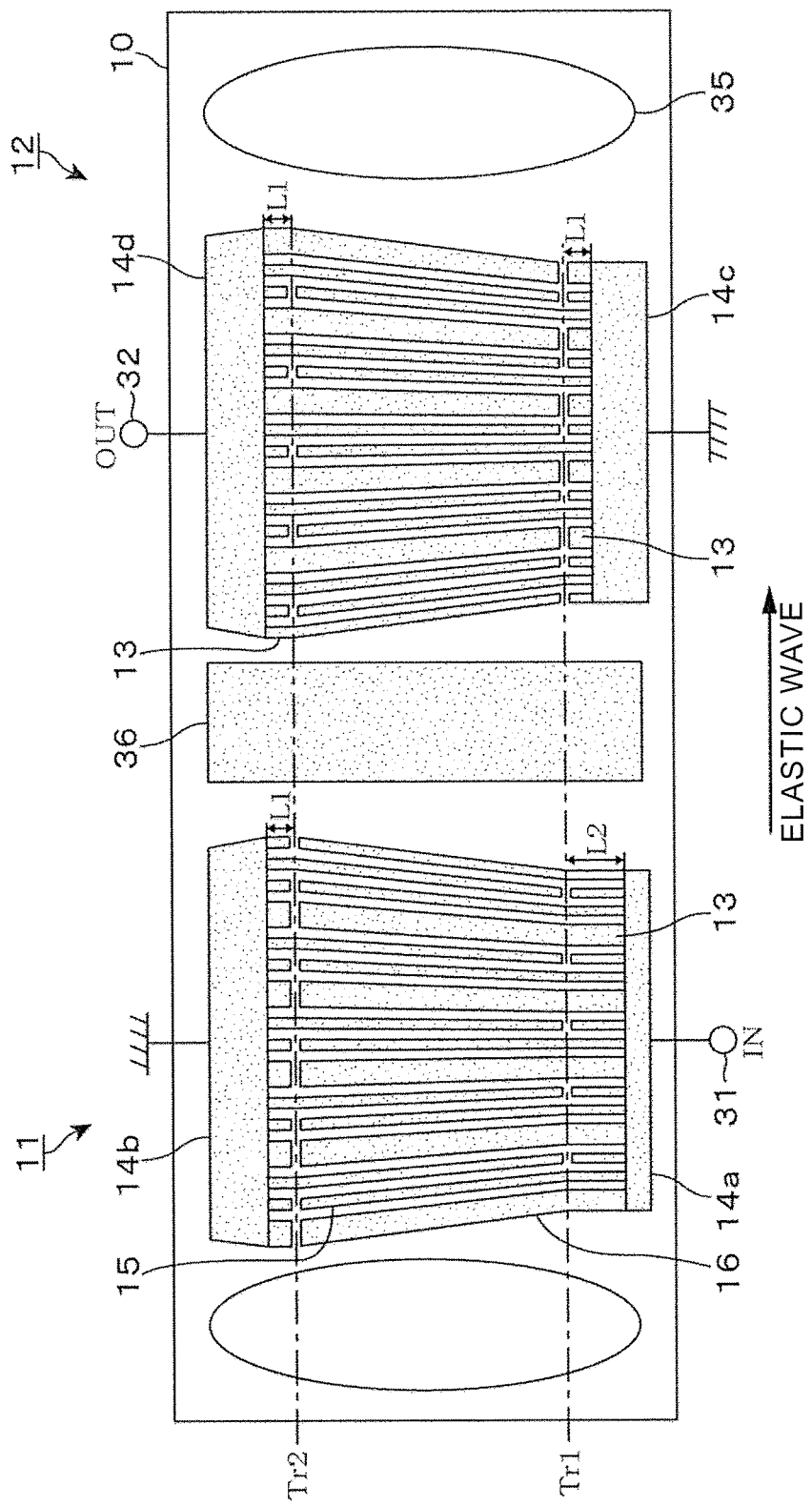
FIG. 10 is a plan view illustrating an exemplary elastic wave filter according to the embodiment of this disclosure.

Accordingly, the length dimension of the dummy electrode 13 disposed at the elastic wave filter may be varied. For example, as illustrated in FIG. 9, the high-pass side dummy electrode 13 of the input-side IDT electrode portion 11 and the low-pass side dummy electrode 13 of the output-side IDT electrode portion 12 may employ the dummy electrode 13 with the length of L2, and the low-pass side dummy electrode 13 of the input-side IDT electrode portion 11 and the high-pass side dummy electrode of the output-side IDT electrode portion 12 may have the length of L1. Alternatively, as illustrated in FIG. 10, the high-pass side dummy electrode 13 of the input-side IDT electrode portion 11 may employ a dummy electrode with a length of L2, and the low-pass side dummy electrode 13 of the input-side IDT electrode portion 11 and the high-pass side and low-pass side dummy electrodes 13 of the output-side IDT electrode portion 12 may have a length of L1.

Figure 11:
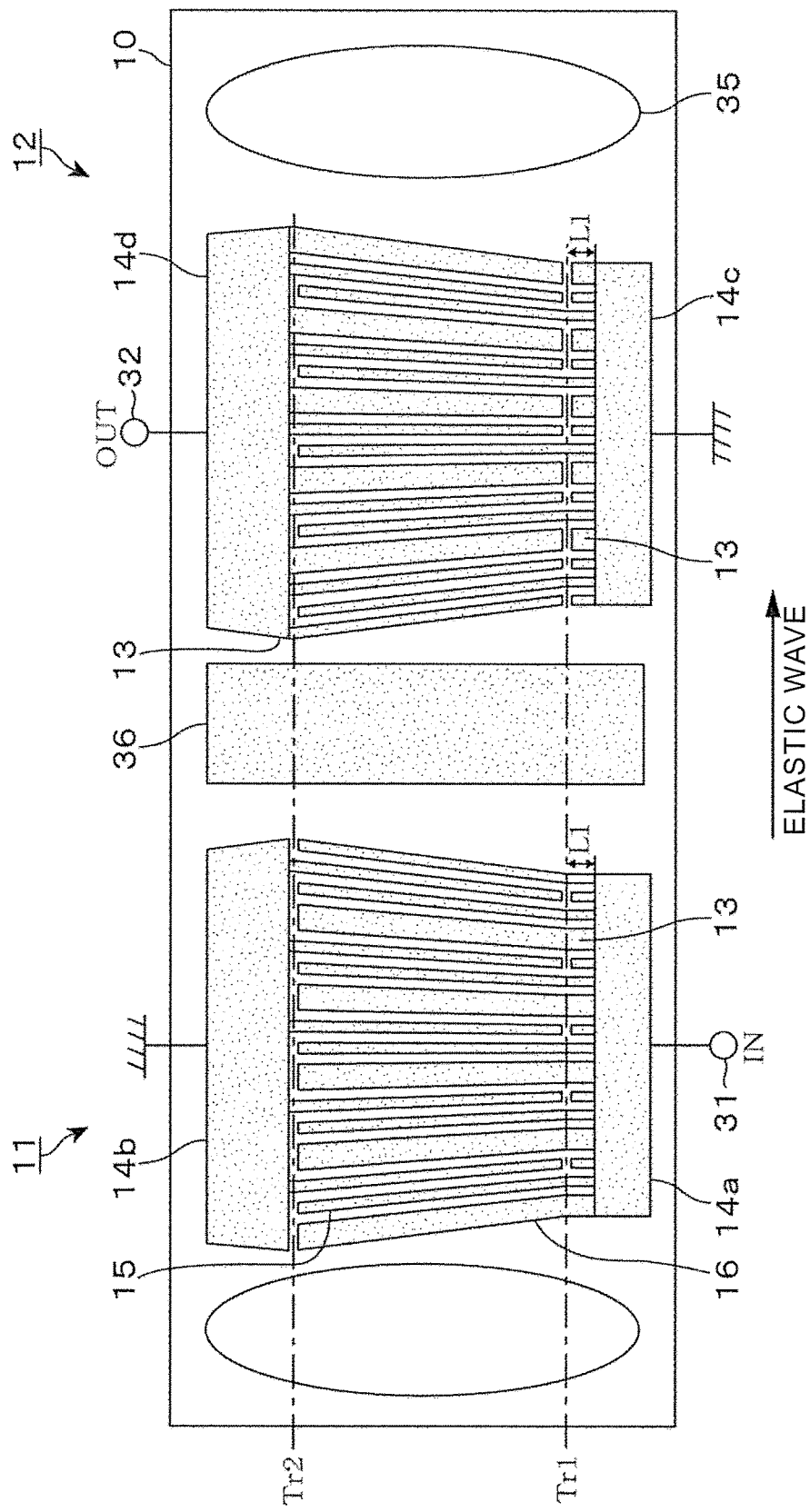
FIG. 11 is a plan view illustrating an exemplary elastic wave filter according to the embodiment of this disclosure.

As described above, the high-pass side busbars 14a and 14c include the dummy electrodes 13 to suppress the spurious response at the high-pass side of the pass-band in the characteristic graph (FIG. 4) illustrating a relationship between the frequency and the attenuation characteristic. Additionally, disposing the dummy electrodes 13 at the low-pass side busbars 14b and 14d suppresses the spurious response at the low-pass side of the pass-band. This effect is provided by the suppression of the reflection not only in the case where the dummy electrodes are disposed in both the IDT electrode portions 11 and 12 at the input side and the output side, but also in the case where the dummy electrodes 13 are disposed in one of the input side and the output side. For example, the following configurations or similar configuration as illustrated in FIG. 11 may be possible. The dummy electrodes 13 are disposed on the high-pass side busbars 14a and 14c of the IDT electrode portions 11 and 12 at the input side and the output side while the dummy electrodes 13 are not disposed on the low-pass side busbars 14b and 14d. Alternatively, the dummy electrodes 13 are disposed on the low-pass side busbars 14b and 14d in the IDT electrode portions 11 and 12 at the input side and the output side while the dummy electrodes 13 are not disposed in the high-pass side busbars 14a and 14c.

The following configurations also have the effect for suppressing the spurious response. The dummy electrodes 13 are disposed in the busbars 14a and 14b at the high-pass side and the low-pass side of the input-side IDT electrode portion 11 while the dummy electrodes 13 are not disposed in the output-side IDT electrode portion 12. Alternatively, for example, the dummy electrodes 13 are disposed at the high-pass side busbar 14a of the input-side IDT electrode portion 11 while the dummy electrodes 13 are not disposed at the low-pass side busbar 14b of the input-side IDT electrode portion 11 and the high-pass side and low-pass side busbars 14c and 14d in the output-side IDT electrode portion 12.

Figure 12:
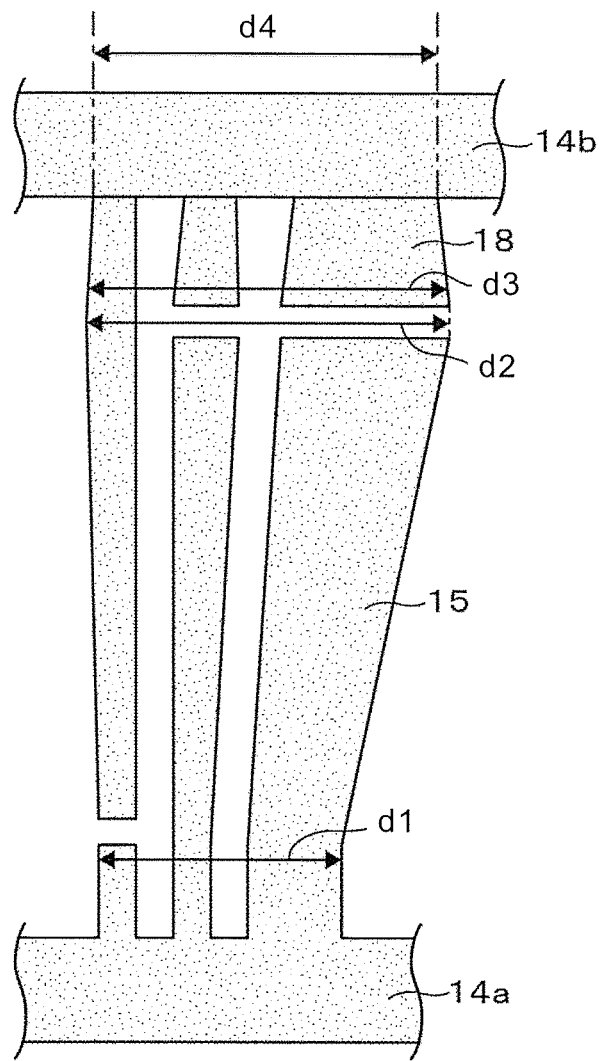
FIG. 12 is an explanatory view illustrating an exemplary configuration of an IDT electrode portion according to the embodiment of this disclosure.
Figure 13:
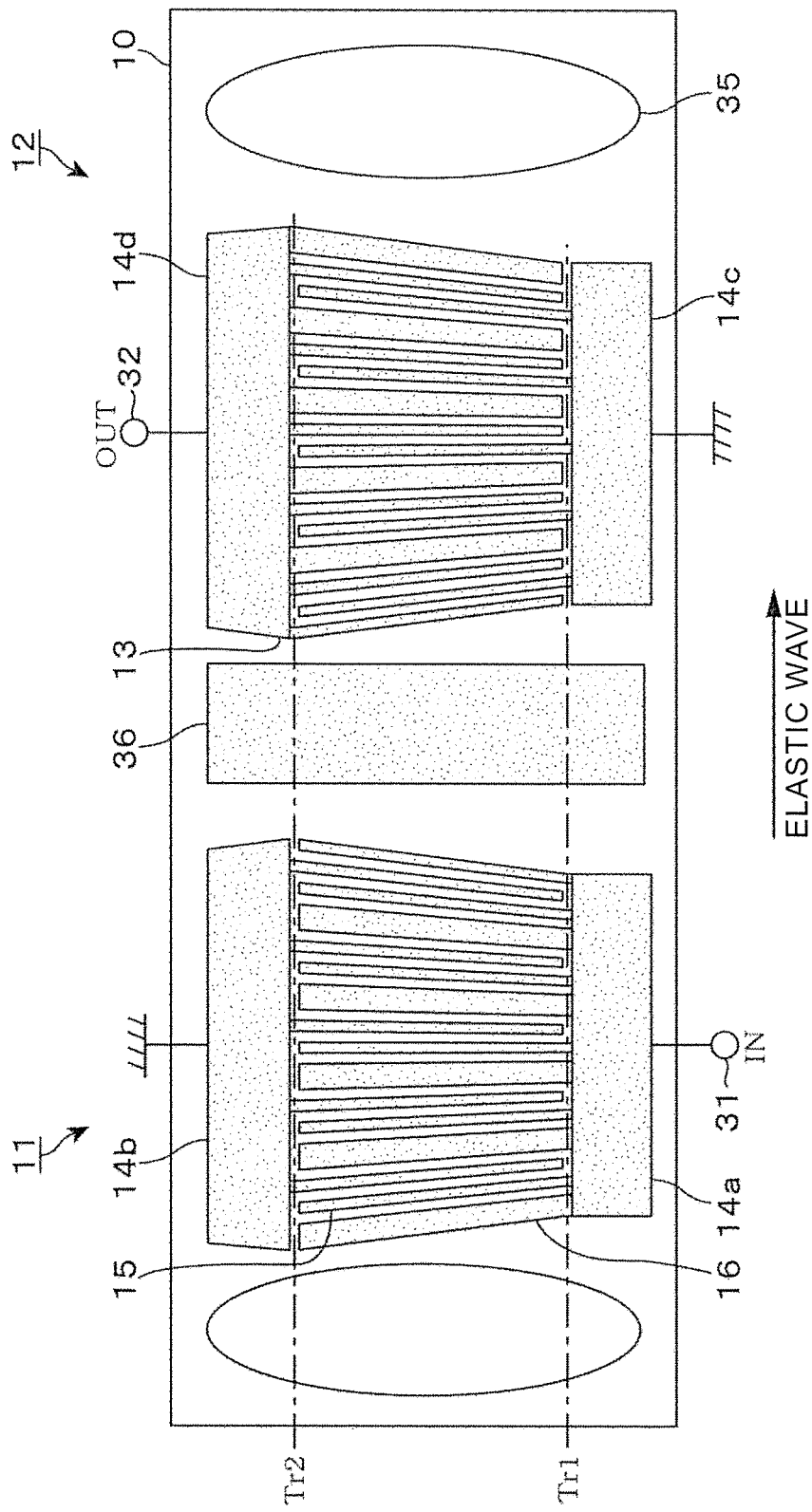
FIG. 13 is an exemplary elastic wave filter according to a known embodiment.

Additionally, the dummy electrode 13 is not required to align the length dimensions in the arranged group, and similarly not required to align the width dimensions. Furthermore, the width dimension of the dummy electrode 13 varies the influence on the pass frequency characteristics. Additionally, the shape of the dummy electrode 13 may be varied corresponding to the spurious response generated in the attenuation characteristic of the elastic wave filter. For example, as illustrated in FIG. 12, instead of the rectangular shape of the dummy electrode 13 to be disposed, a trapezoidal dummy electrode 18 that is tapered in the longitudinal direction to vary its width dimension may be employed or a dummy electrode with a curved side edge may be employed. In the elastic wave filter with the tapered electrode portion, the period unit λ of the electrode fingers 15 and the reflecting electrodes 16 determines a propagation wavelength. Accordingly, a range of the period unit λ indicated by the arrangement pattern of the electrode fingers 15 and the reflecting electrodes 16 becomes the frequency pass-band. Accordingly, with the tapered dummy electrode 18, the period unit λ of the dummy electrode 18 has an affected attenuation characteristic of the frequency band at the high-pass side or the low-pass side of the frequency pass-band in the case where the configuration includes an arrangement pattern with a period unit λ exceeding the maximum period unit (d2 illustrated in FIG. 12) constituted by the electrode fingers 15 and the reflecting electrodes 16 disposed in the IDT electrode portion, or a period unit λ or less than the minimum period unit (d1 illustrated in FIG. 12). Accordingly, in the arrangement region of the dummy electrode 18, it is preferred that satisfying the period unit band λ outside of the pass-band of the filter be avoided. Thus, as illustrated in FIG. 8, if the maximum period unit in the arrangement region of the dummy electrodes 18 is assumed to be d3 and the minimum period unit is assumed to be d4, $d1 \le d4 \le d3 \le d2$ is necessary to be set. That is, it is necessary that the width dimension parallel to the busbar in the dummy electrode be equal to or less than the width dimension of the electrode fingers 15 on the track Tr1 and equal to or more than the width dimension of the electrode fingers 15 on the track Tr2.

The elastic wave filter according to this disclosure may have the following configuration. The dummy electrode is disposed in each of the input-side IDT electrode portion and the output-side IDT electrode portion. A group of dummy electrodes in the output-side IDT electrode portion is disposed at an extending side of the propagation direction of the elastic wave viewed from a group of dummy electrodes in the input-side IDT electrode portion.

Alternatively, the elastic wave filter according to this disclosure may have the following configuration. The dummy electrode is disposed both at the first busbar side and the second busbar side in at least one of the input-side IDT electrode portion and the output-side IDT electrode portion.

Additionally, the elastic wave filter according to this disclosure may have the following configuration. In the case where a group of dummy electrodes arranged along the first busbar or the second busbar in the input-side IDT electrode portion or the output-side IDT electrode portion is referred to as a dummy electrode arrangement group, the dummy electrodes in the dummy electrode arrangement group have the same length dimension. A length dimension of the dummy electrode in at least one dummy electrode arrangement group is different from a length dimension of the dummy electrode in another dummy electrode arrangement group.

In this disclosure, an elastic wave filter with a tapered interdigital transducer has the following configuration. In at least one of the input-side IDT electrode portion and the output-side IDT electrode portion, between: the distal end of the electrode fingers extending from the one busbar among the respective busbars disposed at the high-pass side and the low-pass side; and the other busbar, the dummy electrode separated from the distal end is disposed. This suppresses reflection of the diffracted elastic wave by the busbars and suppresses spurious response in the end portion of the frequency pass-band so as to provide the elastic wave filter that has an excellent frequency pass-band.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An elastic wave filter, comprising:
   electrode fingers;
   a first busbar and a second busbar; and
   inclined electrode portions each having a narrower distance between the electrode fingers from the first busbar toward the second busbar, wherein
   the inclined electrode portions are constituted as an input-side IDT electrode portion and an output-side IDT electrode portion, the input-side IDT electrode portion and the output-side IDT electrode portion being separated from one another in a propagation direction of an elastic wave,
   the elastic wave filter includes a dummy electrode disposed in at least one of the input-side IDT electrode portion and the output-side IDT electrode portion to suppress reflection of a diffracted elastic wave by the busbar and to suppress spurious response at an end portion in a frequency pass-band,
   the dummy electrode is disposed between a distal end of the electrode fingers and another busbar, the electrode fingers extending from one busbar among the first busbar and the second busbar, the dummy electrode being disposed separately from the distal end, the dummy electrode extending from the other busbar, and
   the dummy electrode has a width dimension and a pitch that are determined such that none of a period shorter than a shortest period of the electrode fingers and a period longer than a longest period of the electrode fingers is satisfied.

2. The elastic wave filter according to claim 1, wherein
   the dummy electrode is disposed in each of the input-side IDT electrode portion and the output-side IDT electrode portion, and
   a group of dummy electrodes in the output-side IDT electrode portion is disposed at an extending side of the propagation direction of the elastic wave viewed from a group of dummy electrodes in the input-side IDT electrode portion.

3. The elastic wave filter according to claim 2, wherein
   the dummy electrode is disposed both at the first busbar side and the second busbar side in at least one of the input-side IDT electrode portion and the output-side IDT electrode portion.

4. The elastic wave filter according to claim 3, wherein
   a dummy electrode arrangement group includes the dummy electrodes with a same length dimension, the dummy electrode arrangement group is a group of dummy electrodes arranged along the first busbar or the second busbar in the input-side IDT electrode portion or the output-side IDT electrode portion, and
   a length dimension of the dummy electrode in at least one dummy electrode arrangement group is different from a length dimension of the dummy electrode in another dummy electrode arrangement group.

5. The elastic wave filter according to claim 2, wherein
   a dummy electrode arrangement group includes the dummy electrodes with a same length dimension, the dummy electrode arrangement group is a group of dummy electrodes arranged along the first busbar or the second busbar in the input-side IDT electrode portion or the output-side IDT electrode portion, and
   a length dimension of the dummy electrode in at least one dummy electrode arrangement group is different from a length dimension of the dummy electrode in another dummy electrode arrangement group.

6. The elastic wave filter according to claim 1, wherein
   the dummy electrode is disposed both at the first busbar side and the second busbar side in at least one of the input-side IDT electrode portion and the output-side IDT electrode portion.

7. The elastic wave filter according to claim 6, wherein
   a dummy electrode arrangement group includes the dummy electrodes with a same length dimension, the dummy electrode arrangement group is a group of dummy electrodes arranged along the first busbar or the second busbar in the input-side IDT electrode portion or the output-side IDT electrode portion, and
   a length dimension of the dummy electrode in at least one dummy electrode arrangement group is different from a length dimension of the dummy electrode in another dummy electrode arrangement group.

8. The elastic wave filter according to claim 1, wherein
   the dummy electrodes are not tapered and extend perpendicularly from one busbar among the first busbar and the second busbar, and
   the width dimension and the pitch of the dummy electrodes are unchanged from the electrode fingers side toward the busbar side.

* * * * *